US005296656A

United States Patent [19]

Jung

[11] Patent Number: 5,296,656

[45] Date of Patent: Mar. 22, 1994

[54] SOUND COLLECTING AND CONCENTRATING DEVICE FOR ATTACHING TO THE BACK OF MULTIPLE LOUDSPEAKERS

[76] Inventor: Gin Kon Jung, 93-7 3GA Jung Ang Dong, iri-City Junbuk 570-120, Rep. of Korea

[21] Appl. No.: 15,976

[22] Filed: Feb. 10, 1993

Related U.S. Application Data

[63] Continuation-in-part of Ser. No. 714,529, Jun. 13, 1991, Pat. No. 5,206,465, which is a continuation-in-part of Ser. No. 531,660, Jun. 1, 1990, Pat. No. 5,025,886, and a continuation-in-part of Ser. No. 638,968, Jan. 9, 1991.

[30] Foreign Application Priority Data

| | | | |
|---|---|---|---|
| Nov. 26, 1990 | [KR] | Rep. of Korea | 16514 |
| Nov. 26, 1990 | [KR] | Rep. of Korea | 16515 |
| Nov. 26, 1990 | [KR] | Rep. of Korea | 16516 |

[51] Int. Cl.$^5$ .............................................. H05K 5/00

[52] U.S. Cl. .................................... 181/152; 181/156; 181/159; 181/179

[58] Field of Search ............... 181/144, 145, 148, 151, 181/152, 153, 156, 159, 177, 187, 188, 179, 199; 381/156

[56] References Cited

U.S. PATENT DOCUMENTS

| | | | |
|---|---|---|---|
| 1,853,955 | 4/1932 | Blattner | 181/188 |
| 2,228,886 | 1/1941 | Olson | 181/158 |
| 3,993,162 | 11/1976 | Juuti | 181/156 |
| 4,439,644 | 3/1984 | Bruney, III | 181/151 |
| 4,524,846 | 6/1985 | Whitby | 181/152 |
| 4,553,628 | 11/1985 | Nakamura | 181/145 |
| 4,616,731 | 10/1986 | Robinson | 181/153 |
| 4,629,029 | 12/1986 | Gunness | 181/199 X |
| 4,655,315 | 4/1987 | Saville | 181/153 |
| 4,807,293 | 2/1989 | Weckler | 181/152 X |
| 4,930,596 | 6/1990 | Saiki et al. | 181/156 |

FOREIGN PATENT DOCUMENTS

| | | | |
|---|---|---|---|
| 0061871 | 1/1944 | Denmark | 181/148 |
| 322084 | 10/1934 | Italy | 181/188 |

*Primary Examiner*—Michael L. Gellner
*Assistant Examiner*—Khanh Dang
*Attorney, Agent, or Firm*—Pennie & Edmonds

[57] ABSTRACT

A loudspeaker system and a loudspeaker housing system uses a plurality of smaller rated loudspeakers to generate a high-level output. Specifically, the plurality of loudspeakers are housed in a corresponding number of substantially cylindrical sound collecting tubes, one tube for each loudspeaker. Sound waves, which are generated toward the rear of each loudspeaker and which are otherwise attenuated by the insulation material or reflected by baffles and/or walls and ultimately dissipate, instead travel through the tube, the tube forming a sound traveling path. Each tube converge and merge smoothly into a single substantially cylindrical tube. The sound waves traveling through the individual tubes are merged at the converged tube. The outlet of the single converged tube is connected to or is integral with a conventional or specialized sound concentrating horn to direct the captured sound to a desired direction.

23 Claims, 10 Drawing Sheets

SOUND COLLECTING AND CONCENTRATING DEVICE FOR ATTACHING TO THE BACK OF MULTIPLE LOUDSPEAKERS

This application is a continuation-in-part of application Ser. No. 07/714,529, filed Jun. 13, 1991, now U.S. Pat. No. 5,206,465, which is a continuation in part of application Ser. No. 07/531,660, now U.S. Pat. No. 5,025,886, filed Jun. 1, 1990, and a continuation-in-part of pending application Ser. No. 07/638,968, filed Jan. 9, 1991; and related to the following Design Applications which were all filed on Jan. 9, 1991; Ser. No. 07/639,180; Ser. No. 07/639,179; and Ser. No. 07/639,178.

BACKGROUND

The present invention is drawn to a novel loudspeaker system and a loudspeaker housing system for capturing and concentrating sound waves that are emitted toward the back side of a plurality of loudspeakers.

In the past, attempts have been made to improve the efficiency of a loudspeaker which is capable of accurately reproducing high-fidelity sound. Specifically, attempts of improvement have been made in two areas of the loudspeaker system: 1) the loudspeaker cone and diaphragm utilizing modern materials; and 2) the housing that encases the loudspeaker, to reduce unwanted vibration and resonation within the housing. A loudspeaker system utilizing or manipulating sound waves directed toward the rear of the speaker has been proposed, for example, in U.S. Pat. No. 4,439,644 to Bruney, III, U.S. Pat. No. 4,524,846 to Whitby, U.S. Pat. No. 4,655,315 to Saville, U.S. Pat. No. 4,807,293 to Weckler, and U.S. Pat. No. 4,930,596 to Saiki et al.

In U.S. Pat. No. 4,439,644 to Bruney, III (Bruney), a loudspeaker system utilizes a plurality of vinyl sheets having different thicknesses to seal the rear of a speaker housing, to relieve pressure behind the loudspeaker driver, and to attenuate sound waves emitted toward the rear of the speaker. While this type of system minimizes the housing vibration and generation of the spring-like compression effect or the resonant booming effect often associated with an acoustic suspension enclosure, the speaker is not as efficient as a ported speaker system in general. Unlike the prior inventions, the present invention captures and concentrates sound waves which are emitted toward the rear of at least two loudspeaker and directs the sound waves to a singular sound concentrating horn and the like.

In U.S. Pat. No. 4,524,846 to Whitby and U.S. Pat. No. 4,807,293 to Weckler, a loudspeaker system directs sound waves radiated rearwardly into the chamber(s) in the housing through a convoluted path. This type is known to provide a fairly reputable performance. However, due to sound waves colliding against baffles stationed in the housing, resonance in the baffle and the housing cannot be avoided when driving at high volume levels, coloring or distorting its true sound.

Additionally, in order to produce a high level output the loudspeaker diaphragm must be large and the thrust distance, i.e., the forward traveling distance, must be relatively long. This structural arrangement for producing a high level output requires a special design and expensive material. Furthermore, because the diaphragm must be large and strong to sustain the high level output, the end result is that the diaphragm will have to possess a large inertia (mass), which reduces diaphragm sensitivity and undesirably increases the response time, thus reducing the high fidelity capability.

In U.S. Pat. No. 4,655,315 to Saville and U.S. Pat. No. 4,930,596 to Saiki et al., a loudspeaker is housed in a specially configured sound collecting tube to modify the frequency response. The efficiency of the speaker, however, in such an arrangement is reduced because the sound travels through restricted openings, which may react much like the baffles in the housing. Furthermore, because of the frequency response modification, colored or distorted sound is likely to occur, whereas in the present invention, a freely aspirated sound collecting tubes do not color the sound and thus the sound generated from the loudspeaker is heard directly without being colored or distorted.

In contrast with the prior speaker system, in the present invention, a high level output is produced by collecting and concentrating sound waves generated from a plurality of smaller rated loudspeakers and output to a single horn. The production cost can be significantly reduced vis-a-vis a single high-level output loudspeaker system, while fully rendering the maximum high-fidelity capability of a smaller rated loudspeaker system because of their smaller inertia and thrust distance. Moreover, there are no baffle or medium which can cause resonation or unwanted sound reflections within the speaker housing. Sound waves passing through the tubes are freely "breathable". In other words, pressure build-up behind the speaker and sound reflections within the confines of the speaker housing, which cause undesirable sound distortion, are avoided or at least minimized by routing and concentrating sound waves through the sound collecting tubes which house the loudspeakers.

SUMMARY OF THE INVENTION

This invention is directed to a novel high level outputting loudspeaker system which utilizes a plurality of smaller rated loudspeakers. Specifically, the plurality of loudspeakers are housed in a corresponding number of substantially cylindrical sound collecting tubes, one tube for each loudspeaker. Sound waves, that are emitted from the back side of each loudspeaker and that are otherwise attenuated by the insulation material or reflected by baffles and/or walls and ultimately dissipate, instead travel through the tube, the tube forming a sound traveling path. The tubes converge and merge smoothly into a single substantially cylindrical tube. Sound waves traveling through the individual tubes are merged at the converged tube. The outlet of the single converged tube is connected to or is integral with a conventional or customized sound concentrating horn to direct the captured sound to a desired direction.

To minimize the acoustic resistance, the area of the speaker frame which supports the diaphragm in the back of the loudspeaker should be minimized to prevent sound waves emitted toward the rear of the loudspeaker from reverberating off the frame. This maximizes the utilization of sound waves that are emitted toward the rear of the loudspeaker diaphragm and in return maximizes the efficiency and the high-fidelity capability of the loudspeaker system.

Also, in one embodiment of the present invention, to minimize the acoustic resistance in the sound collecting tube, the cross-sectional area of each sound collecting tube at the inlet is preferably equal to that of the diaphragm. The cross-sectional area of the sound collecting tube at the inlet is also preferably slightly greater than that at the outlet, although any dimension can be used so long as the tube does not restrict or interfere with the sound output. Furthermore, since the permanent magnet and the moving coil of the loudspeaker occupies the central area at the inlet, the tube must wide enough at the inlet to permit sound waves to travel through the tube with a minimum acoustic resistance. The above preferred specified dimension permits sound waves to travel through the tube with a minimum acoustic resistance.

In another embodiment, the inlet end of each of the sound collecting tubes is preferably substantially equal to at least one of the cutouts or the cutout in the back of the loudspeaker so that the inlet can shroud over the cutout with minimal sound output interference. The cross-sectional area of the inlet is preferably smaller than that at the outlet of the sound collecting tube in this embodiment.

All of the cylindrical sound collecting tubes that houses the loudspeakers smoothly join to a single cylindrical tube. At this junction, the cross sectional area does not have to be equal to the sum of the individual cylindrical tube areas. As long as the sound path from the individual collecting tubes to the converged cylindrical tube is smooth as to provide a minimum acoustic resistance, the area of the joined cylinder can be made close to or slightly greater than the outlet cross-sectional area of the individual sound collecting tubes to minimize the overall dimension of the present system.

The outlet of the converged sound collecting tube is connected to or is integral with a sound horn which can be in the shape of the horn of the brass instruments or sound amplifying horns and the like which collect and concentrate sound waves passing therethrough. In essence, the horn prevents the sound waves from dispersing radially, and instead concentrates sound waves in a specific direction. Moreover, the individual loudspeakers can be directed to any desired direction. In other words, the loudspeakers can be pointed to different directions relative to each other and to the direction of the horn, for example, by using sound collecting tubes having different bends and curves.

Accordingly, one object of the invention is to provide a high level outputting loudspeaker system capable of efficiently and accurately reproducing high fidelity sound by providing a plurality of smaller rated loudspeakers in a corresponding number of sound collecting tubes to collect and concentrate sound waves that are emitted toward the rear of each loudspeaker.

Another object of the invention is to provide a loudspeaker system capable of concentrating and outputting the combined output to a single horn.

Another object of the invention is to provide a loudspeaker system having a plurality of loudspeakers, in which the loudspeakers can be pointed to different directions relative to each other and to the direction of the horn by using sound collecting tubes having different bends and curves.

The use of a plurality of smaller rated loudspeakers with a single sound concentrating or focusing horn provides distinctive advantages in lowered production cost and increased efficiency while maintaining a high-fidelity capability of a smaller rated loudspeaker as compared to a conventional high-level outputting loudspeaker, whether it utilizes a single sound concentrating horn or not.

The foregoing invention and features and advantages of the present invention will be better understood and appreciated from the following description.

BRIEF DESCRIPTION OF THE DRAWINGS

FIG. 19 is a partial front elevational view of FIG. 18, showing only the frontal face.

FIG. 20 is a side elevational view of FIG. 18.

DETAILED DESCRIPTION OF THE DRAWINGS

Figure 1:
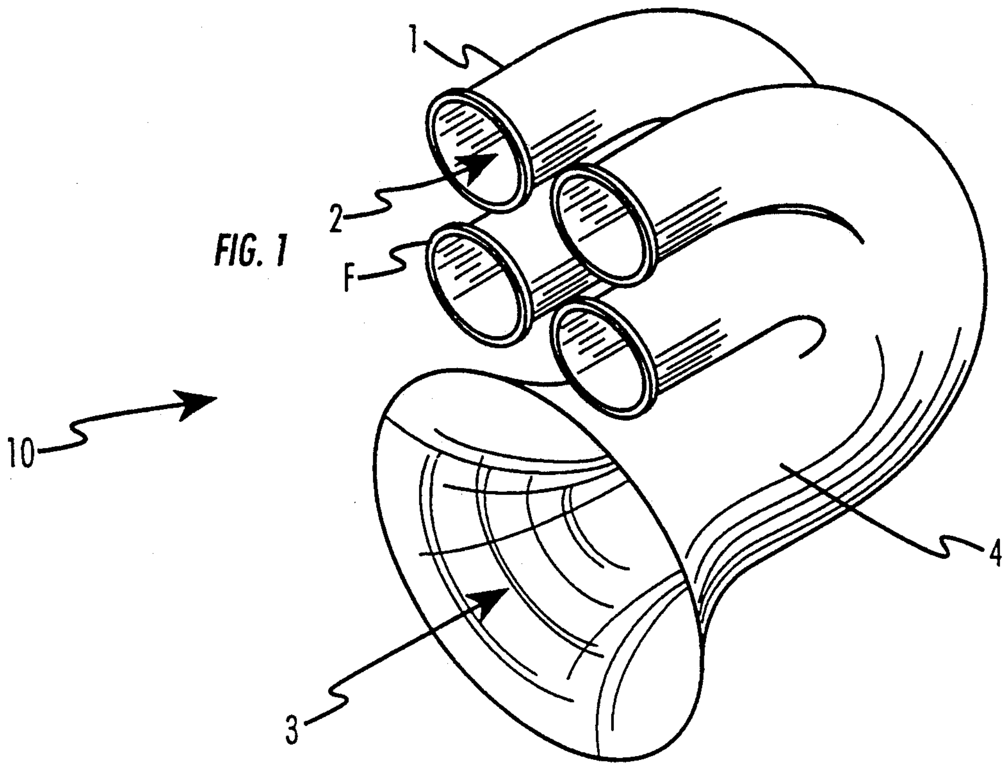
FIG. 1 is a perspective view of the first embodiment of the present loudspeaker housing for housing four loudspeakers and showing a first type of inlet ends.

The present invention, as shown in the drawings, shows five different embodiments of the loudspeaker housing. Same reference numerals have been designated for same or similar elements. Furthermore, to facilitate better understanding of the present invention and to make the drawings less complex, the loudspeakers are not shown as being attached to the housing.

The following description generically applies to all of the embodiments contemplated in the present invention.

The features distinct to each embodiment, which are readily recognizable from the drawings, are separately described below.

Figure 13:
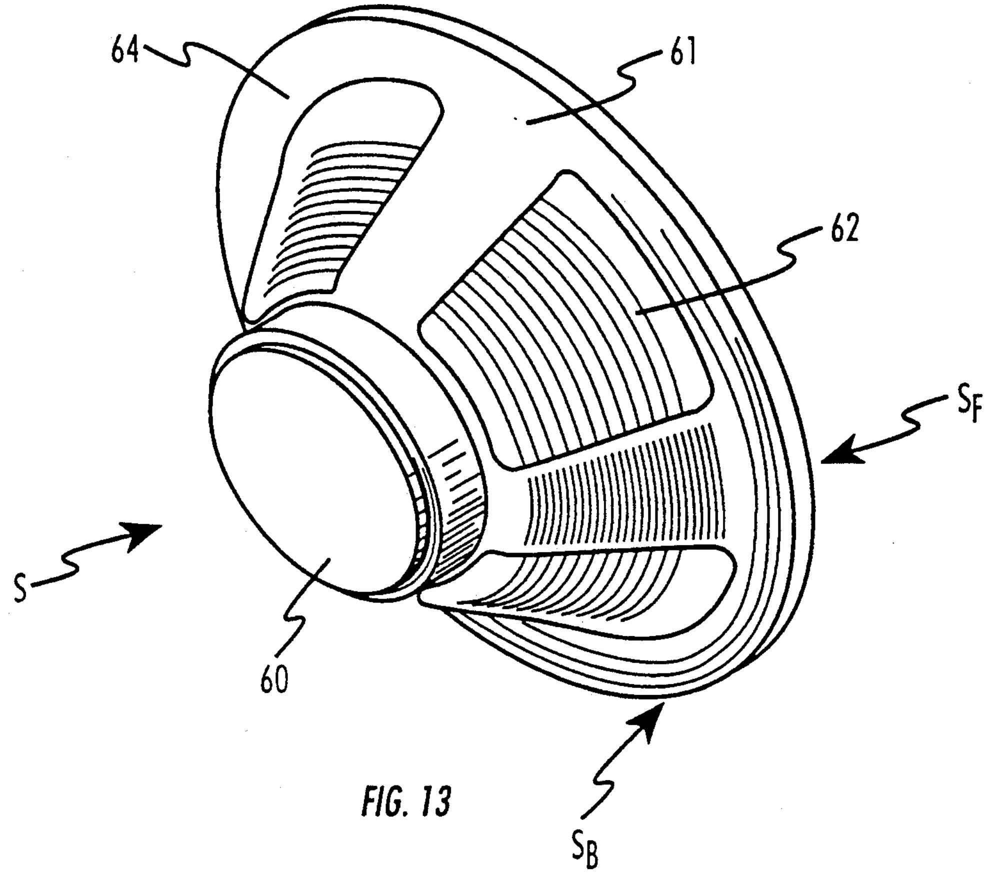
FIG. 13 is a rear perspective view of a loudspeaker of the type housed in the present invention.
Figure 14:
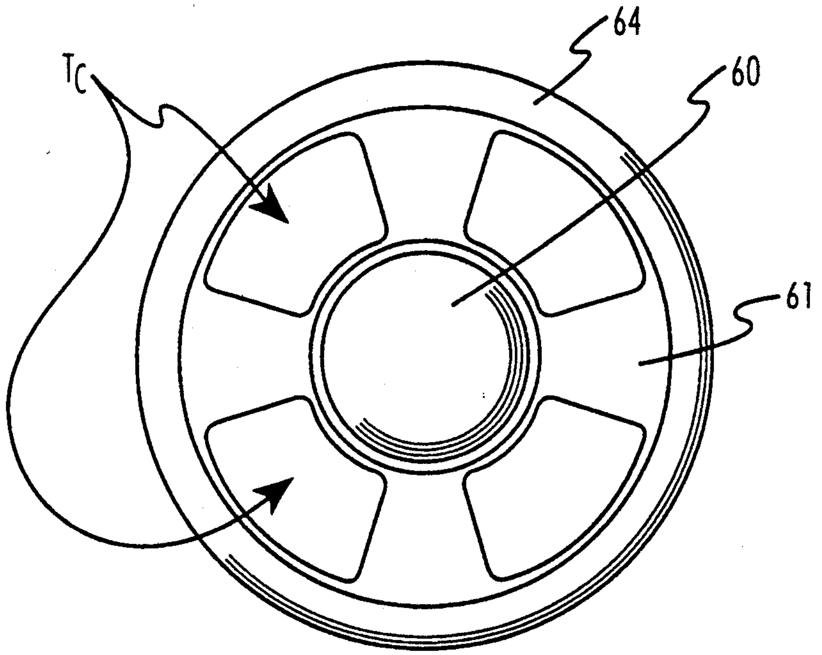
FIG. 14 is a plan view of the rear of the loudspeaker shown in FIG. 13.

The loudspeaker housing 10–50 of the present invention has been contemplated for use with a plurality of loudspeakers of the type having at least one sound venting cutout in the frame of the loudspeaker which supports the cone and the sound driving means. Each loudspeaker of the aforementioned type is housed in or attached to one sound collecting tube 1, using conventional attaching means. The loudspeaker S, shown in FIGS. 13 and 14, generally has a circular cross section with a mounting flange 64 for attaching to a flange F of the inlet end of the sound collecting tube by a conventional loudspeaker to housing attaching means, i.e., screws, bolts, rivets, etc. (not shown).

The loudspeaker of type presently contemplated comprises a diaphragm 62, a cone shaped frame 61 with a plurality of sound venting trapezoidal cut-outs $T_C$. The loudspeaker illustrated has four symmetrical trapezoidal cut-outs in the frame. However, the present invention may be used with any number of trapezoidal cut-outs, depending on the shape of the inlet end. The flange 64 preferably includes a plurality of openings (not shown) to permit conventional fastening means such as screws, bolts, or rivets to be positioned therein. The openings are merely optional since the speaker can be attached using conventional clips and/or adhesive. The speaker is attached to the inlet end of the sound collecting tube by any said conventional fastening means. However, adhesive or double sided tape may be used in addition to the fastening device to securely and sealingly fasten the inlet end to the frame.

Each sound collecting tube houses a single loudspeaker S so that the front $S_F$ of the speaker is exposed to the surrounding where the loudspeaker output is generally greatest. The entire back side $S_B$ of the loudspeaker is housed in the tube 1. Sound that is emitted from the back side of each loudspeaker and which is otherwise attenuated by the insulation material or reflected by baffles and/or walls of the conventional loudspeaker and ultimately dissipate, instead is captured and travels through the tube, the tube forming a sound traveling path.

The sound collecting tubes smoothly merge and converge to a single cylindrical tube 4 before forming into an inlet end portion of the horn 3 to minimize the acoustic resistance through the path of the sound travel. While the present embodiments are shown with the converged tube 4 being integral with the horn 3, it is to be noted and recognized that it is well within the scope and spirit of the present invention to encompass the alternative embodiments where the horn can be removably attached to the converged tube 4 so that differently directed or shaped horns can be readily attached using a conventional tube to tube attaching means such as a clamp, friction fit, threaded fit, etc, as described in the previously identified copending application, Ser. No. 07/714,529 (U.S. Pat. No. 5,206,465) and U.S. Pat. No. 5,025,886.

The horns can be any conventional type. The horns may be readily interchangeable if removably attached to enable the listener to use different types of horns depending on the music and the listener's taste of sound. Note that different horns can produce different sound timbre which changes the tone of the sound. The horn 3 shown in the present embodiments directs sound waves in the direction facing the front of the loudspeaker. A differently curved horns may be also used to direct sound waves to a wall or angled walls for reflecting sound waves in a multi-directional fashion.

Similarly, while the inlet opening ends 2 of the sound collecting tubes, as shown in all of the present embodiments, are preferably aligned in the same direction as the output direction of the horn, the inlet opening ends need not be aligned in the same direction. That is, as shown in the drawings, the inlet opening ends 2 of the tubes all face in the same direction and in the direction of the output of the horn 3. However, it is well within the scope and spirit of the present invention to alter the direction of the inlet end by interchangeably changing each sound collecting tube with differently curved tubes. By using differently curved and bent sound collecting tubes, the inlet opening can face in any desired direction so as to create a multi-directional loudspeaker system. Moreover, the inlet end portion of the sound collecting tubes can be made from a pliable tubes which can be readily bent and maintained thereabout in any angle and direction with respect to the output direction of the horn.

FIRST EMBODIMENT

Figure 2:
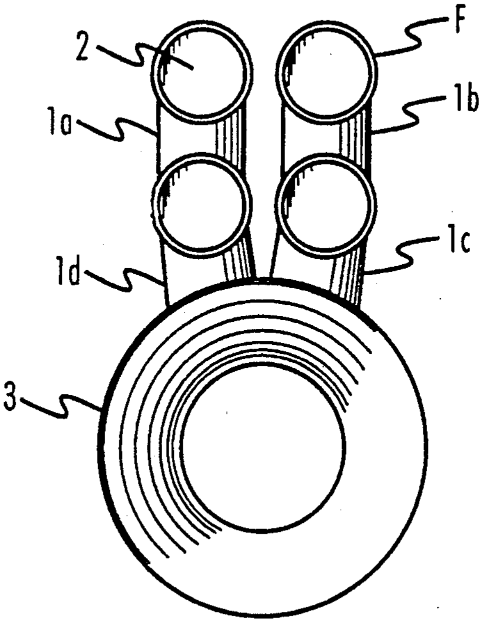
FIG. 2 is a front elevational view of the first embodiment shown in FIG. 1.
Figure 3:
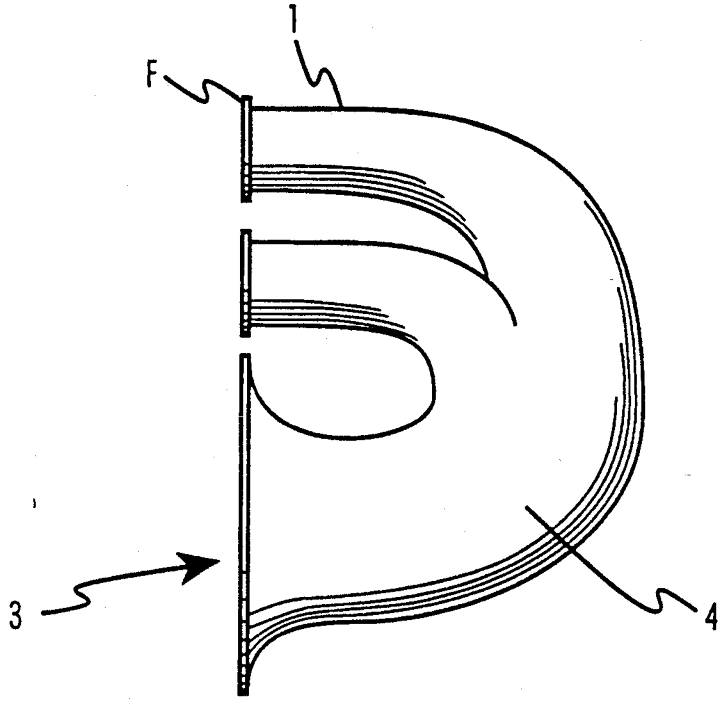
FIG. 3 is a side elevational view of FIG. 1.

The first embodiment contemplates a use of four sound collecting tubes, as shown in the perspective view of FIG. 1. Tubes 1*a*,1*d* and 1*b*,1*c* are vertically aligned and the tubes 1*a*,1*b* and 1*c*,1*d* are horizontally aligned, as shown in FIG. 2. As previously explained, each collecting tube houses a single loudspeaker S with the front side $S_F$ facing the ambient and the back side $S_B$ facing the inlet end 2.

SECOND EMBODIMENT

Figure 4:
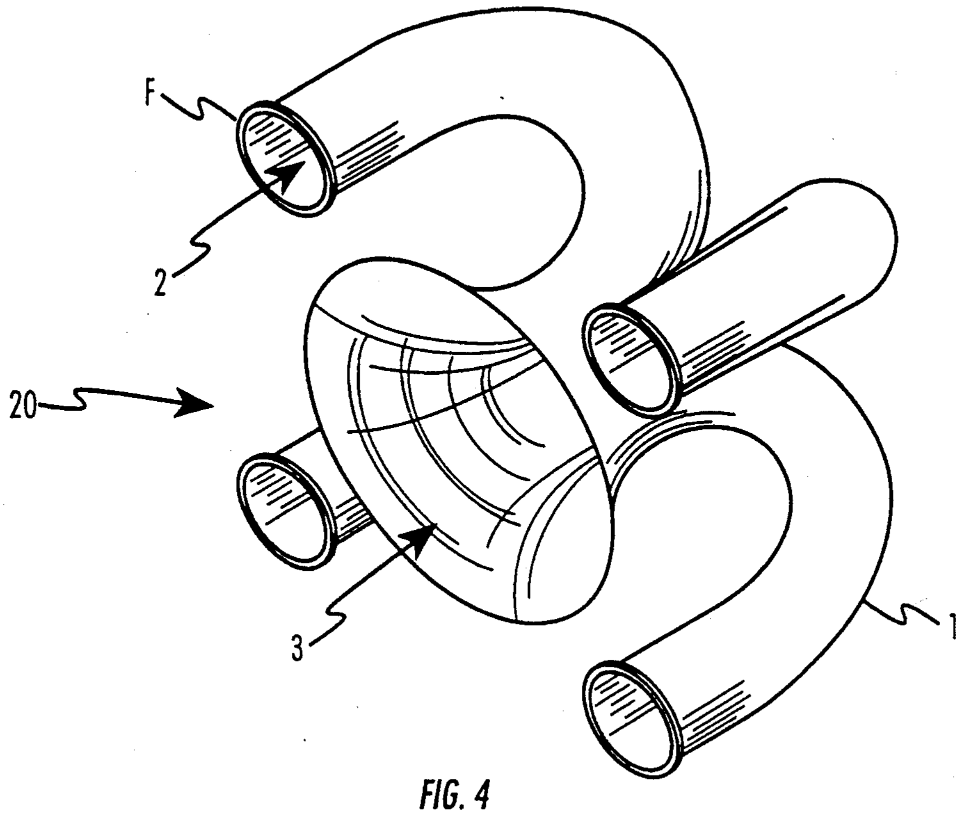
FIG. 4 is a perspective view of the second embodiment of the present loudspeaker housing for housing also four loudspeakers, but with a differently spaced loudspeaker arrangement and showing a first type of inlet ends.
Figure 5:
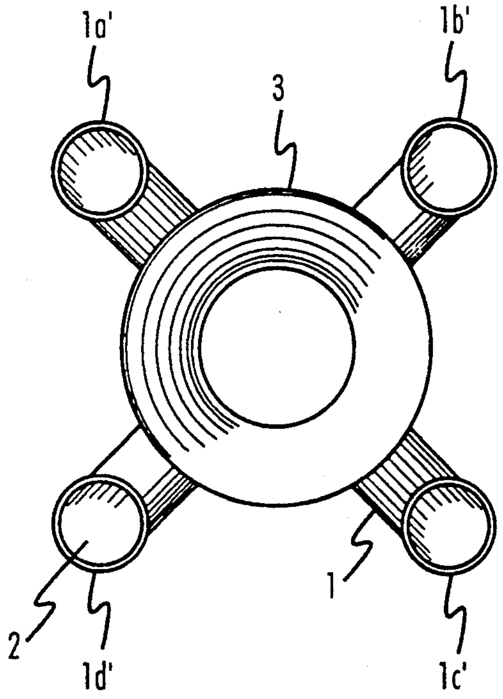
FIG. 5 is a front elevational view of the second embodiment shown in FIG. 4.
Figure 6:
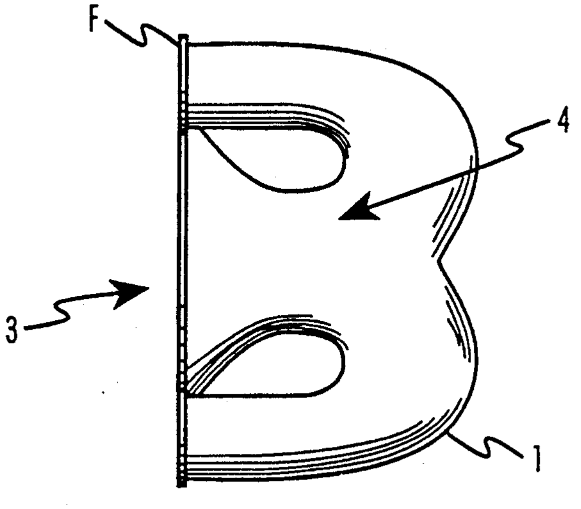
FIG. 6 is a top, side, or bottom elevational view of the second embodiment shown in FIG. 4, the top, side, and bottom views being identical.

The second embodiment also contemplates a use of four sound collecting tubes, as shown in the perspective view of FIG. 4. However, in this embodiment, as shown, the sound collecting tubes are evenly distributed and spaced around the circumference of the horn 3. That is tubes 1*a'*, 1*b'*, 1*c'*, 1*d'* are spaced apart at 90° intervals, as better shown in FIG. 5. As previously explained, each collecting tube houses a single loudspeaker S with the front side $S_F$ facing the ambient and the back side $S_B$ facing the inlet end 2.

THIRD EMBODIMENT

Figure 7:
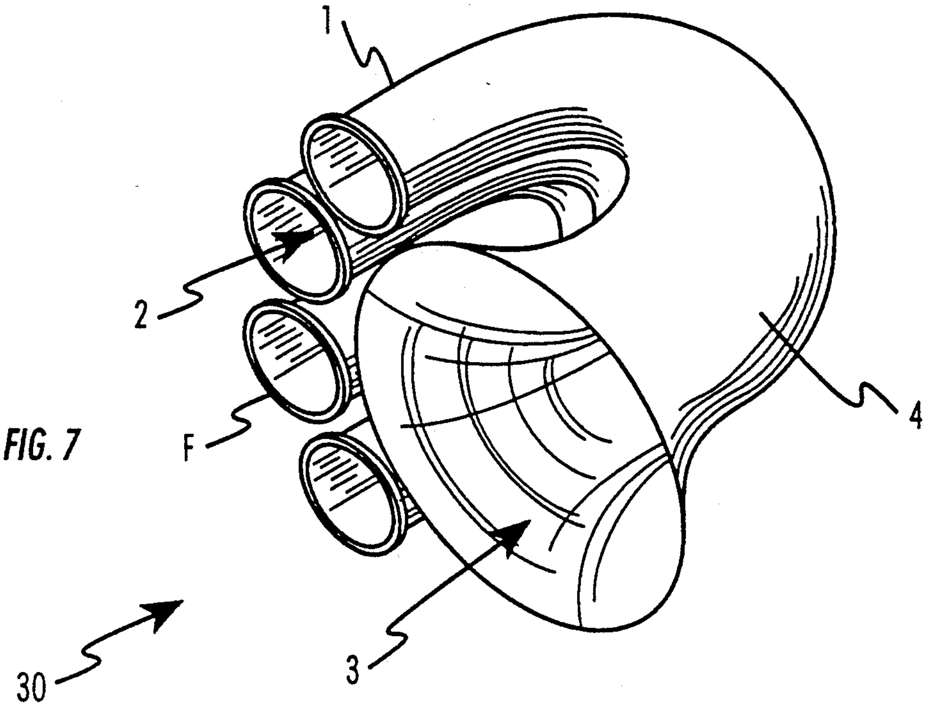
FIG. 7 is a perspective view of the third embodiment of the present loudspeaker housing for housing also four loudspeakers, but with a differently spaced loudspeaker arrangement and showing a first type of inlet ends.

The third embodiment also contemplates a use of four sound collecting tubes, as shown in the perspective view of FIG. 7. This embodiment, however, has the four tubes arranged closely side by side, as better shown in FIG. 8. As previously explained, each collecting tube houses a single loudspeaker S with the front side $S_F$ facing the ambient and the back side $S_B$ facing the inlet end 2.

FOURTH EMBODIMENT

Figure 9:
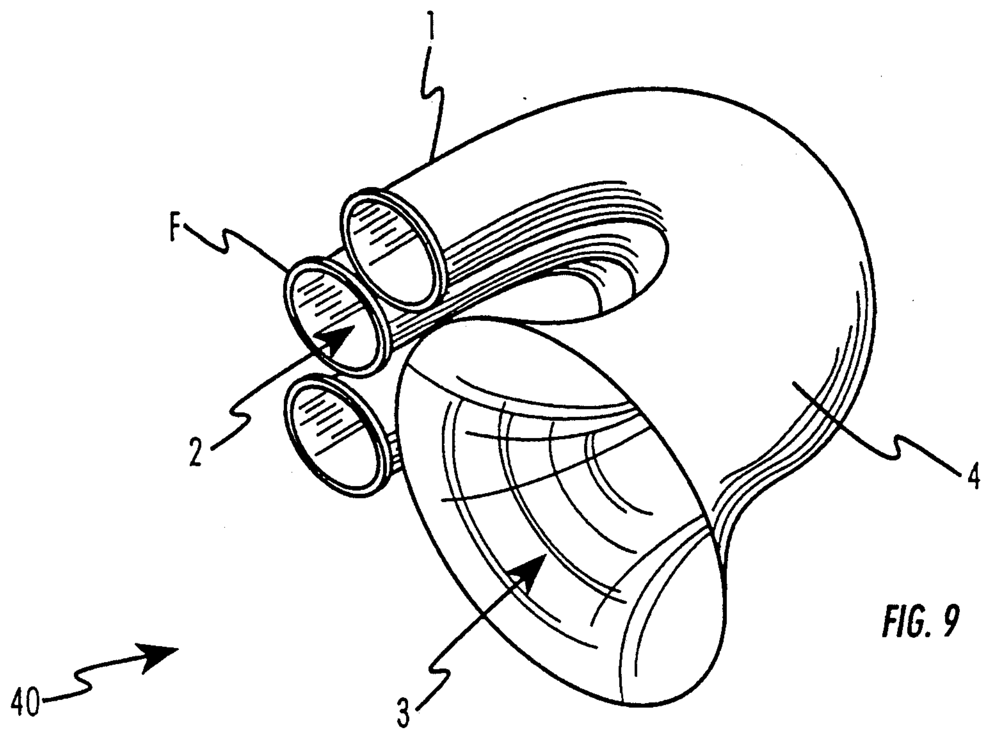
FIG. 9 is a perspective view of the fourth embodiment of the present loudspeaker housing for housing three loudspeakers and showing a first type of inlet ends.

This embodiment is substantially similar to the third embodiment, except that three sound collecting tubes, as shown in the perspective view of FIG. 9, are contemplated rather than four tubes. As previously explained, each collecting tube houses a single loudspeaker S with the front side $S_F$ facing the ambient and the back side $S_B$ facing the inlet end 2.

FIFTH EMBODIMENT

Figure 11:
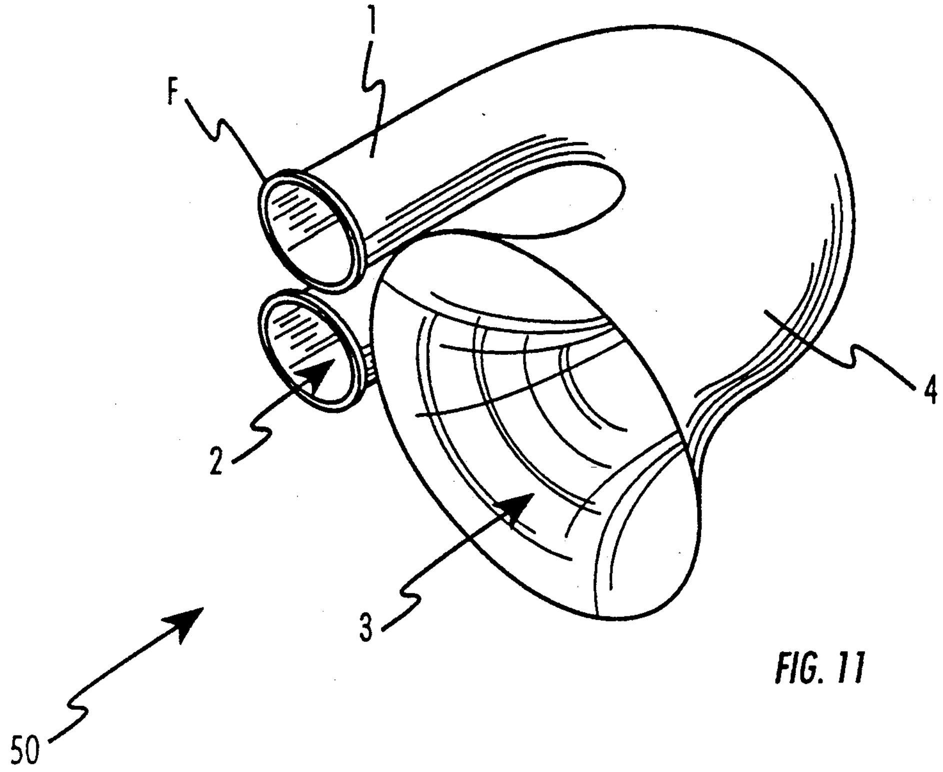
FIG. 11 is a perspective view of the fifth embodiment of the present loudspeaker housing for housing two loudspeakers and showing a first type of inlet ends.
Figure 12:
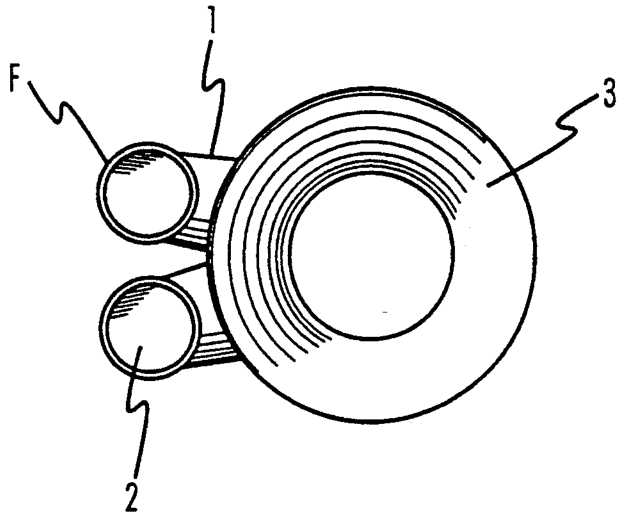
FIG. 12 is a front elevational view of the fifth embodiment shown in FIG. 10.

This embodiment is substantially similar to the fourth embodiment, except that two sound collecting tubes, as shown in the perspective view of FIG. 11, are contemplated rather than three tubes. As previously explained, each collecting tube houses a single loudspeaker S with the front side $S_F$ facing the ambient and the back side $S_B$ facing the inlet end 2.

SECOND EMBODIMENT OF INLET END

Figure 8:
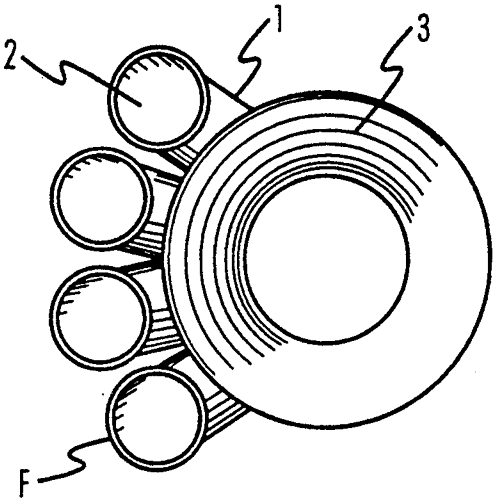
FIG. 8 is a front elevational view of the third embodiment shown in FIG. 7.
Figure 15:
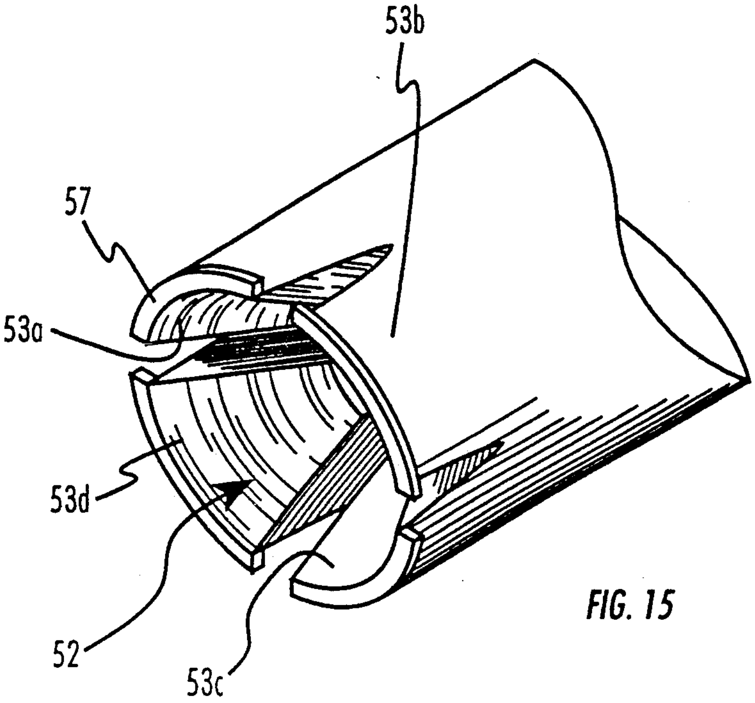
FIG. 15 is a perspective view of a second embodiment of an inlet end, which attaches to the back of a loudspeaker and shrouds over all sound venting trapezoidal openings formed in the frame of the loudspeaker.
Figure 16:
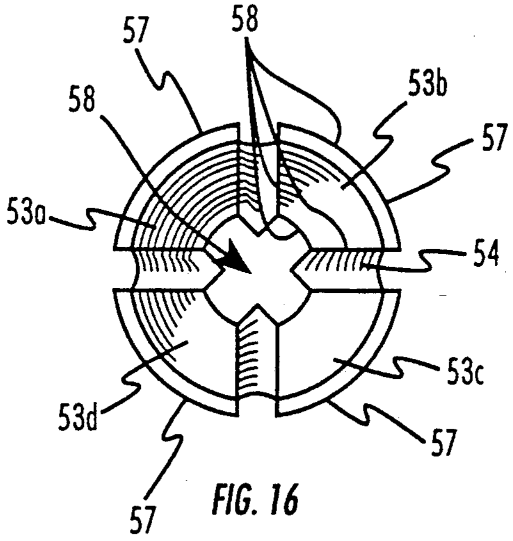
FIG. 16 is a front elevational view of FIG. 15.
Figure 17:
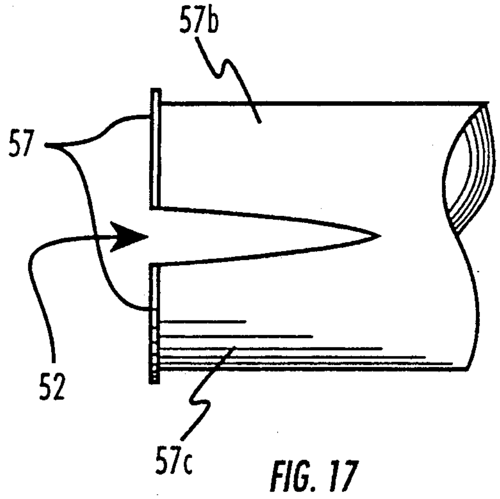
FIG. 17 is a side elevational view of FIG. 15.

FIGS. 15–17 illustrate the second embodiment of the inlet end, which is also similar to the inlet end shown in FIG. 8-1 of my copending Ser. No. 07/714,529 (U.S. Pat. No. 5,206,465). Instead of the circular, free, unobstructed opening shown in the inlet end of the first embodiment, one or more or all of the inlet end may be substituted with the inlet end of the second embodiment. The inlet end of the second embodiment 52 has a diameter that is substantially equal to that of a loudspeaker that is to be attached thereto. In this embodiment, the inlet end of the sound collecting tube has four trapezoidal inlet segments 53*a*, 53*b*, 53*c*, 53*d*, each with a respective rim or flange 57, formed at each inlet end segment. Each flange is attached to a conventional flange formed in the conventional loudspeaker, the flange being primarily used for purposes of mounting to a housing frame or a support.

The four inlet segments correspond to the trapezoidal cut-outs formed in the back of the loudspeaker. That is, the inlet end of this embodiment is mounted to a loudspeaker with each inlet end segment sitting concentrically over one or more of the trapezoidal cut-outs $T_C$ in the loudspeaker frame so that sound emitted from the back of the loudspeaker travels through each inlet end segment with a minimum sound interference. Sound further travels through the sound collecting tube where the collected sound from each inlet end segment is combined, the combined collected sound continuing through and out the horn.

Each of the trapezoidal inlet segments 53*a*, 53*b*, 53*c*, 53*d* has a trapezoidal cross section, bounded by four walls 58. The trapezoidal cross sections of the four inlet segments gradually become larger and larger toward the outlet end direction until the four trapezoidal sections merge into a single circular cross section in the direction of the sound path.

The inlet end of the sound collecting tube further has four slots 54 which separate the trapezoidal inlet segments and which provide space for the frame area between two adjacent trapezoidal cutouts of the loudspeaker to rest therein when the loudspeaker is mounted to the inlet end. Further, a recessed cavity 55 which is formed by the walls 58 of the respective segments 53*a*, 53*b*, 53*c*, 53*d* is provided for the speaker driving means 60 of the loudspeaker to rest therein.

It is to be noted that each inlet end segment shrouds over one or more trapezoidal cut-outs in the loudspeaker frame. Thus, the four inlet end segments may shroud over a loudspeaker frame having, for example, eight trapezoidal cut-outs, each inlet end segment shrouding over two trapezoidal cut-outs.

Alternatively, while the third embodiment is shown with four inlet segments for use with a loudspeaker frame having, for example, four trapezoidal cut-outs, it is to be noted that the present invention contemplates any feasible number of inlet end segments corresponding to the number of cut-outs formed in the loudspeaker frame. For example, if a loudspeaker frame has five trapezoidal cut-outs, a sound collecting tube formed with five inlet end segments may be used. This alternative embodiment may also be used with a loudspeaker frame having ten trapezoidal cut-outs, in the manner just described.

THIRD EMBODIMENT OF INLET END

Figure 18:
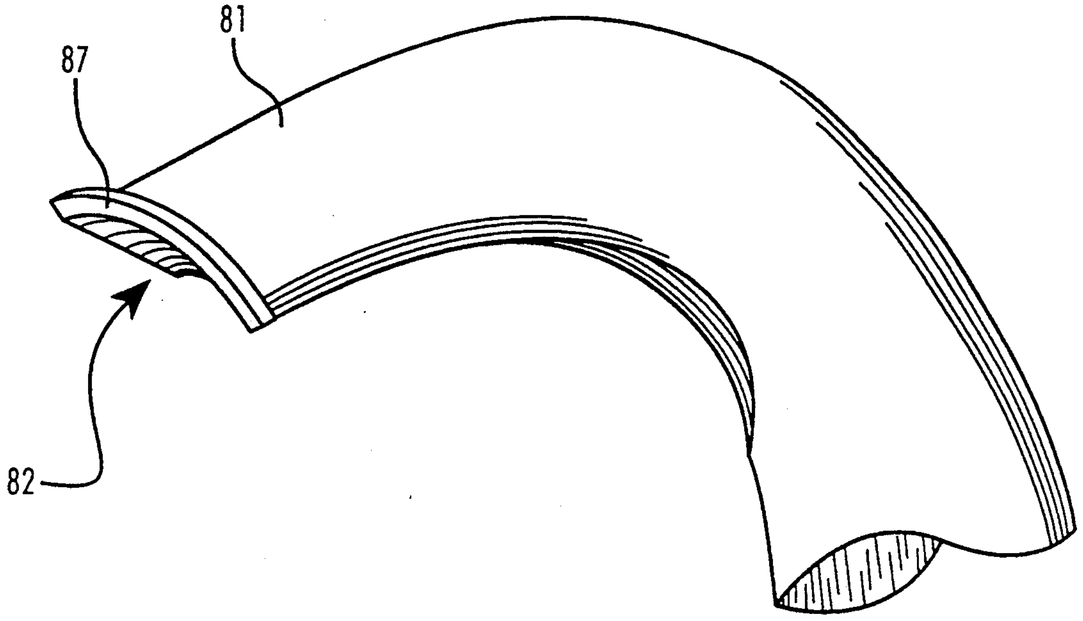
FIG. 18 is a perspective view of a third embodiment of an inlet end, which attaches to the back of a loudspeaker and shrouds over at least one sound venting trapezoidal openings formed in the frame of the loudspeaker.
Figure 18:
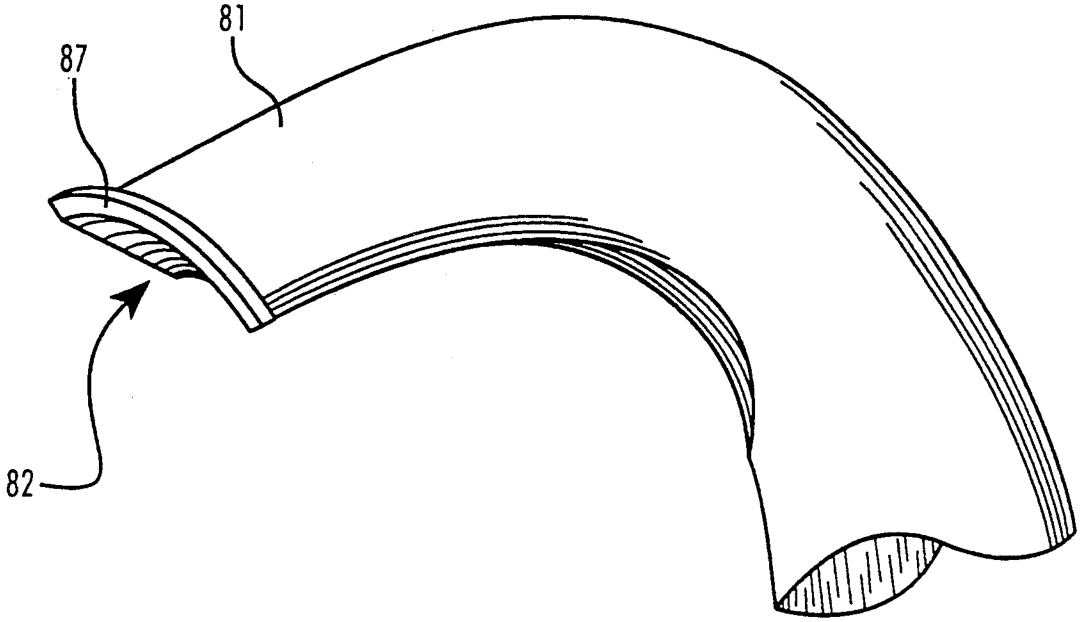

FIGS. 18–20 illustrate the third embodiment of the inlet end, which is similar to the inlet end of FIG. 11-1 of my copending Ser. No. 07/714,529 (U.S. Pat. No. 5,206,465), which may be also used instead of the first inlet end embodiment. The inlet end 82 of the third embodiment is formed as a single unitary inlet which is designed to attach to at least one trapezoidal cut-out segment in the back of the loudspeaker frame via a rim or flange 87 formed at the inlet end. The flange is attached to a conventional flange formed in the conventional loudspeaker using said conventional attaching means.

The inlet end has a trapezoidal cross section, bounded by four walls 88. The trapezoidal cross sections of the four inlet segments gradually become larger toward the outlet end direction. The outlet end may be any size or shape so long as it does not substantially interfere with sound output.

The foregoing description has been only illustrative of the principle of my invention. It is to be understood that the present invention is not to be limited to the exact configuration and construction as illustrated and described herein. Accordingly, all expedient modifications may be made within the scope and spirit of my invention. For example, the sound collecting tube need not be limited to four tubes. The number of tubes can depend on the diameter of the loudspeaker or as matter of listeners preference, any feasible number of sound collecting tubes being possible.

Figure 10:
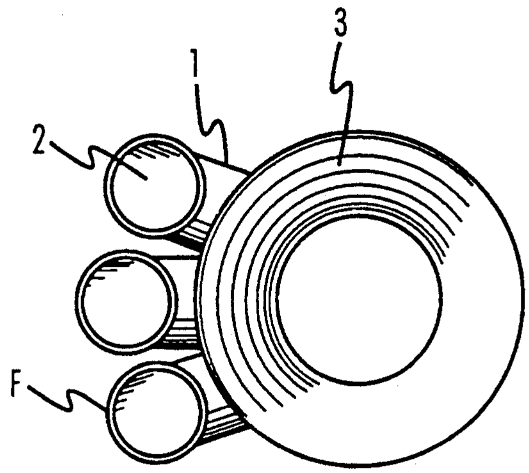
FIG. 10 is a front elevational view of the fourth embodiment shown in FIG. 9.

Moreover, while the inlet end has been shown with three specific embodiments, other shaped inlet end, such as that of FIGS. 9-1 and 10-1 of my copending application Ser. No. 07/714,529 (U.S. Pat. No. 5,206,465) may be used, the disclosure of which is incorporated herein by reference.

What is claimed is:

1. A sound collecting and directing device for attaching to a plurality of loudspeakers each having a diaphragm with a frontal side which generally faces an ambient surrounding and a back side which faces opposite the frontal side; a frame means which operatively supports the diaphragm and a speaker driving means, the frame means having a flange at its outermost peripheral edge; and a plurality of sound venting cut-outs in the frame means to permit sound waves to pass therethrough, said device comprising:

a plurality of sound collecting tubes, each having an inlet end and an outlet end, each inlet end having means for attaching to the back side of one of said loudspeakers so that said inlet end shrouds over at least one of said sound venting cut-outs in the frame means, at least one of said inlet ends having means for isolating the speaker driving means from the sound traveling path in the respective sound collecting tube; and a single sound concentrating and directing horn means connected to all of the outlet ends of said sound collecting tubes, wherein said sound collecting tubes collect sound emitting from the back side of the diaphragm and direct into said horn means.

2. A sound collecting and directing device according to claim 1, wherein each of said inlet ends has means for isolating the speaker driving means from the sound traveling path.

3. A sound collecting and directing device according to claim 2, wherein each of said inlet ends has four inlet end segments for attaching to the frame means which has at least four sound venting cut-outs, at least one of said inlet end segments for shrouding over at least one of said sound venting cut-outs.

4. A sound collecting and directing device according to claim 3, wherein said four end segments are substantially identical in shape, each end segment for shrouding over one of the sound venting cut-outs.

5. A sound collecting and directing device according to claim 4, wherein each end segment has a curved trapezoidal cross-section that conforms to one of said cut-outs.

6. A sound collecting and directing device according to claim 2, wherein each of said inlet ends comprises a trapezoidal shaped cross-sectional tube for shrouding over at least one quadrant or one-fourth the area of the frame means, said trapezoidal shaped cross-sectional tube smoothly forms to a substantially circular cross-section tube toward said outlet end.

7. A sound collecting and directing device according to claim 6, wherein each of said inlet ends is for shrouding over only one trapezoidal cut-out in the frame means.

8. A sound collecting and directing device according to claim 1, wherein said isolating means is a recessed cavity formed by at least one side wall forming the inlet end of the sound collecting tube.

9. A sound collecting and directing device according to claim 1, wherein said plurality of sound collecting tube comprises two through four sound collecting tubes.

10. A sound collecting and directing device according to claim 5, wherein said plurality of sound collecting tube comprises two through four sound collecting tubes.

11. A sound collecting and directing device according to claim 7, wherein said plurality of sound collecting tube comprises two through four sound collecting tubes.

12. A sound collecting and directing device for attaching to a plurality of loudspeakers each having a diaphragm with a frontal side which generally faces an ambient surrounding and a back side which faces opposite the frontal side; a frame means for operatively supporting the diaphragm and a speaker driving means, the frame means having a flange at its outermost peripheral edge; and at least two sound venting cut-outs in the frame means, which permit sound waves to pass therethrough, said device comprising:

a plurality of sound collecting tubes, each having an inlet end and an outlet end, each inlet end having a flange means for attaching to the flange of the frame means to attach said inlet end to the frame means to shroud said inlet end over at least one of the cut-outs in the frame means, said inlet end having means for isolating the speaker driving means from the sound traveling path in the respective sound collecting tube; and a single sound concentrating and directing horn means connected to all of said outlet ends of said sound collecting tubes, wherein each of said sound collecting tube collects sound emitting from the back side of the diaphragm and directs into said horn means.

13. A sound collecting and directing device according to claim 12, wherein said isolating means is a recessed cavity formed by at least one wall forming said inlet end of said sound collecting tube.

14. A sound collecting and directing device according to claim 13, wherein each of said inlet ends has four inlet end segments for attaching to the frame means which has at least four sound venting cut-outs, at least one of said inlet end segments for shrouding over at least one sound venting cut-out.

15. A sound collecting and directing device according to claim 14, wherein said four end segments are substantially identical in shape, each end segment for shrouding over one of the sound venting cut-outs.

16. A sound collecting and directing device according to claim 15, wherein each end segment has a curved trapezoidal cross-section that conforms to said one cut-out.

17. A sound collecting and directing device according to claim 13, wherein each of said inlet ends comprises a trapezoidal shaped cross-sectional tube for shrouding over at least one quadrant or one-fourth the area of the frame means, said trapezoidal shaped cross-sectional tube smoothly forms to a substantially circular cross-section tube toward said outlet end.

18. A sound collecting and directing device according to claim 17, wherein each of said inlet ends is for shrouding over only one trapezoidal cut-out in the frame means.

19. A sound collecting and directing device according to claim 12, wherein said plurality of sound collecting tube comprises two through four sound collecting tubes.

20. A sound collecting and directing device according to claim 15, wherein said plurality of sound collecting tube comprises two through four sound collecting tubes.

21. A sound collecting and directing device according to claim 17, wherein said plurality of sound collecting tube comprises two through four sound collecting tubes.

22. A sound collecting and directing system comprising:

a plurality of loudspeakers each having a diaphragm with a frontal side which generally faces an ambient surrounding and a back side which faces opposite the frontal side; a frame means which operatively supports the diaphragm and a speaker driving means, the frame means having a flange at its outermost peripheral edge; and a plurality of sound venting cut-outs in the frame means to permit sound waves to pass therethrough;

a plurality of sound collecting tubes, each having an inlet end and an outlet end, each inlet end having means for attaching to the back side of one of said loudspeakers so that said inlet end shrouds over at least one of said sound venting cut-outs in the frame means, at least one of said inlet ends having means for isolating the speaker driving means from the sound traveling path in the respective sound collecting tube; and a single sound concentrating and directing horn means connected to all of the outlet ends of said sound collecting tubes, wherein said sound collecting tubes collect sound emitting from the back side of the diaphragm and direct into said horn means.

23. A sound collecting and directing system comprising:

a plurality of loudspeakers each having a diaphragm with a frontal side which generally faces an ambient surrounding and a back side which faces opposite the frontal side; a frame means for operatively supporting the diaphragm and a speaker driving means, the frame means having a flange at its outermost peripheral edge; and at least two sound venting cut-outs in the frame means, which permit sound waves to pass therethrough;

a plurality of sound collecting tubes, each having an inlet end and an outlet end, each inlet end having a flange means for attaching to the flange of the frame means to attach said inlet end to the frame means to shroud said inlet end over at least one of the cut-outs in the frame means, each inlet end having means for isolating the speaker driving means from the sound traveling path of the respective sound collecting tube; and a single sound concentrating and directing horn means connected to all of said outlet ends of said sound collecting tubes, wherein each of said sound collecting tube collects sound emitting from the back side of the diaphragm and directs into said horn means.

* * * * *